United States Patent
Ho et al.

(10) Patent No.: US 7,728,384 B2
(45) Date of Patent: Jun. 1, 2010

(54) MAGNETIC RANDOM ACCESS MEMORY USING SINGLE CRYSTAL SELF-ALIGNED DIODE

(75) Inventors: Chiahua Ho, Hsinchu (TW); Yenhao Shih, Hsinchu (TW); Hsiang-Lan Lung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/420,930

(22) Filed: May 30, 2006

(65) Prior Publication Data

US 2007/0279978 A1 Dec. 6, 2007

(51) Int. Cl.
    *H01L 23/62* (2006.01)
(52) U.S. Cl. ............... 257/351; 257/442; 365/225.5
(58) Field of Classification Search ............ 257/351, 257/422; 365/225.5
    See application file for complete search history.

(56) References Cited

U.S. PATENT DOCUMENTS

| | | | |
|---|---|---|---|
| 5,841,692 A | 11/1998 | Gallagher et al. | 365/173 |
| 6,114,719 A | 9/2000 | Dill et al. | 257/295 |
| 6,560,135 B2 | 5/2003 | Matsuoka et al. | 365/97 |
| 6,562,634 B2* | 5/2003 | Bronner et al. | 438/3 |
| 6,567,299 B2 | 5/2003 | Kunikiyo et al. | 365/173 |
| 6,744,086 B2* | 6/2004 | Daughton et al. | 257/295 |
| 6,795,334 B2 | 9/2004 | Iwata et al. | 365/158 |
| 7,172,954 B2* | 2/2007 | Hierlemann | 438/527 |
| 7,200,032 B2* | 4/2007 | Braun et al. | 365/158 |
| 2002/0093845 A1 | 7/2002 | Matsuoka et al. | 365/97 |
| 2003/0076703 A1 | 4/2003 | Kim et al. | 365/105 |
| 2003/0117834 A1 | 6/2003 | Iwata et al. | 365/158 |
| 2003/0128603 A1* | 7/2003 | Savtchenko et al. | 365/200 |
| 2004/0108561 A1* | 6/2004 | Jeong | 257/422 |
| 2004/0140522 A1* | 7/2004 | Yoshhara et al. | 257/528 |
| 2007/0069296 A1* | 3/2007 | Park et al. | 257/351 |

FOREIGN PATENT DOCUMENTS

EP 1321942 6/2003

* cited by examiner

*Primary Examiner*—Hoai V Ho
*Assistant Examiner*—Jason Lappas
(74) *Attorney, Agent, or Firm*—Stout, Uxa, Buyan & Mullins, LLP

(57) ABSTRACT

A magnetic random access memory (MRAM) cell comprises a MRAM device and a single crystal self-aligned diode. The MRAM device and the single crystal self-aligned diode are connected through a contact. Only one metal line is positioned above the MRAM device of the MRAM cell. A first and second spacers positioned adjacent to the opposite sidewalls of the contact define the size of the single crystal self-aligned diode. A first and second metal silicide lines are positioned adjacent to the first and second spacers, respectively. The single crystal self-aligned diode, defined in a silicon substrate, includes a bottom implant (BI) region and a contact implant (CI) region. The CI region is surrounded by the BI region except for a side of the CI region that aligns the surface of the silicon substrate. A fabrication method, a read method, two programming methods for the MRAM cell are also disclosed.

12 Claims, 11 Drawing Sheets

US 7,728,384 B2

MAGNETIC RANDOM ACCESS MEMORY USING SINGLE CRYSTAL SELF-ALIGNED DIODE

BACKGROUND OF THE INVENTION

1. Field of the Invention

The present invention relates generally to a magnetic random access memory (MRAM), and more particularly, to a MRAM cell using a single crystal self-aligned diode and methods for operating and fabricating the same.

2. Description of the Related Art

The magnetic random access memory (MRAM) is a memory cell that is capable of performing nonvolatile memory operations. A MRAM cell consists of two devices: a MRAM device and a selective device. The MRAM device of a MRAM cell is used to store information, whereas the selective device of a MRAM cell is used for preventing the MRAM device from being affected by other MRAM cells in a MRAM array, such as the leakage current. A MRAM cell has high speed, low power consumption, and high integration density.

Formed by multi-layer ferromagnetic thin films, the MRAM device of a MRAM cell can have either in-plane or perpendicular magnetization directions relative to the surfaces of the ferromagnetic thin films. Because the resistance of the MRAM device changes according to the magnetization directions formed in the multi-layer ferromagnetic thin films, the information stored at the MRAM device of a MRAM cell is read by sensing current variations due to the resistance change.

The selective device of a MRAM cell can be either a diode or a transistor. A single crystal diode or a poly-crystal diode may be used for the selective device for a MRAM cell. However, a single crystal diode has the difficulty to shrink its size and a poly-crystal diode has a current leakage problem at the reverse bias region. Alternatively, a transistor can be used for the selective device of a MRAM cell, however, the fabrication process for a transistor is more complicated than the one for a diode. Furthermore, the size of a transistor is also larger than the size of a diode.

In view of the foregoing, there is a need for a MRAM cell using a new selective device that has small size and simple fabrication process.

SUMMARY OF THE INVENTION

Broadly speaking, the present invention fills this need by providing a magnetic random access memory (MRAM) cell that includes a MRAM device and a single crystal self-aligned diode. Two programming methods, a read method, and a fabrication method for the MRAM cell are also disclosed.

In accordance with one aspect of the present invention, a MRAM cell is provided. The MRAM cell comprises a MRAM device and a selective device, wherein the selective device is a single crystal self-aligned diode. The single crystal self-aligned diode includes a bottom implant (BI) region and a contact implant (CI) region. Having a first polarity, the BI region is defined in a silicon substrate. The CI region is defined in the portion of the silicon substrate that is within the BI region such that the CI region is surrounded by the BI region except for a side of the CI region that aligns with the surface of the silicon substrate. The CI region has a second polarity that is opposite to the first polarity of the BI region. A contact is defined over the CI region. A first spacer and a second spacer are respectively defined adjacent to the opposite sidewalls of the contact. A first metal silicide line and a second metal silicide line are defined adjacent to the first spacer and the second spacer, respectively. The thickness of each of the first spacer and the second spacer defines the size of the single crystal self-aligned diode. Finally, a MRAM device is defined over the contact.

The MRAM device of the MRAM cell can have either in-plane or perpendicular magnetization direction relative to the surface of the MRAM device. The MRAM device has a MRAM structure that is selected from the group consisting of magnetic tunnel junction (MTJ) stack, giant magneto resistance (GMR) stack, colossus magneto resistance (CMR) stack, the MTJ with Savtchenko film stack, the GMR with Savtchenko film stack.

In accordance with another aspect of the present invention, a method for fabricating a MRAM cell is described. The fabrication method includes forming a metal silicide layer over a silicon substrate and patterning and etching the metal silicide layer until the underlying silicon substrate is exposed to form a trench. Then, a BI region is formed by implanting a first impurity doping into the silicon substrate through the trench. A conformal dielectric layer is formed over the metal silicide layer and the trench such that the sidewalls and the bottom of the trench are covered. Next, an inter-layer dielectric (ILD) layer is formed over the conformal dielectric layer. A contact hole is formed by patterning the ILD layer above the BI region and etching through the ILD layer and the conformal dielectric layer until the BI region is reached. Next, a CI region is formed by implanting a second impurity doping through the contact hole into the BI region such that the CI region is surrounded by the BI region except for a side of the CI region that aligns with the surface of the silicon substrate. The second impurity doping has an opposite polarity of the first impurity doping and the CI region and the BI region form a single crystal self-aligned diode. After a contact is formed by filling in the contact hole, a MRAM device is formed over the contact.

In accordance with yet another aspect of the present invention, a method for reading a MRAM cell in a MRAM array is described. Each column of the MRAM cells in the MRAM array shares the same BI region that functions as a bit line, each row of the MRAM cells of the MRAM array shares the same metal line that is connected to the MRAM device through a via contact and functions as a word line. A metal silicide line is positioned between any two columns of the MRAM cells of the MRAM array. First, a positive voltage is applied to the word line of the MRAM cell to be read. Then, the bit line of the MRAM cell to be read is grounded. As a result, a current will flow from the word line of the MRAM cell to be read to the bit line of the MRAM cell to be read. This current will be sensed to detect the information stored in the MRAM cell.

In accordance with yet another aspect of the present invention, a method for programming a MRAM cell with an in-plane magnetization direction in a MRAM array is described. Each column of the MRAM cells of the MRAM array shares the same BI region that functions as a bit line, each row of the MRAM cells of the MRAM array shares the same metal line that functions as a word line, and each column of the MRAM cells of the MRAM array shares a first and second metal silicide lines that are positioned respectively at opposite sides of each column of the MRAM cells. To program the MRAM cell with an in-plane magnetization direction in a MRAM array, a first and second programming currents are generated on the first and second metal silicide lines of the MRAM cell to be programmed such that the first and second programming currents have the same flow direction. A third programming current is generated on the word line of the MRAM cell to be programmed.

In accordance with a further aspect of the present invention, a method for programming a MRAM cell with a perpendicular magnetization direction in a MRAM array is described. Each column of the MRAM cells of the MRAM array shares the same BI region that functions as a bit line, each row of the MRAM cells of the MRAM array shares the same metal line that functions as a word line, and each column of the MRAM cells of the MRAM array shares a first metal silicide line and a second metal silicide line that are positioned respectively to opposite sides of each column of the MRAM cells. To program the MRAM cell with a perpendicular magnetization direction in a MRAM array, a first programming current is generated on the first metal silicide line of the MRAM cell to be programmed, and a second programming current is generated on the second metal silicide line of the MRAM cell to be programmed such that the first and second programming currents have opposite flow directions. A third programming current is generated on a first adjacent word line positioned adjacent to a first side of the word line of the MRAM cell to be programmed. Finally, a fourth programming current is generated on a second adjacent word line positioned adjacent to a second side of the word line of the MRAM cell to be programmed such that the third programming current and the fourth programming current have opposite flow directions. The first side of the word line of the MRAM cell to be programmed is opposite to the second side of the word line of the MRAM cell to be programmed.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1A:
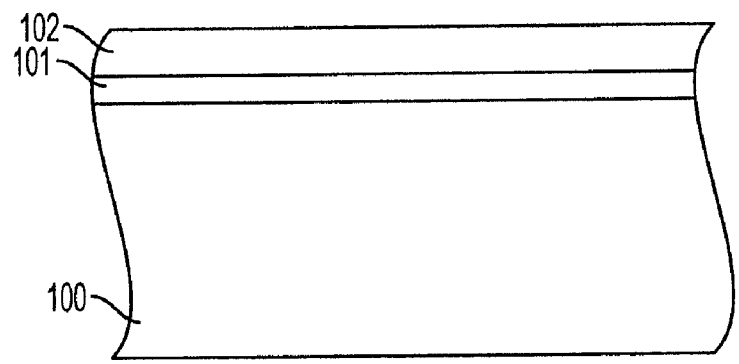
FIG. 1(A)-(N) illustrate an exemplary method for fabricating magnetic random access memory (MRAM) cells along with the periphery in accordance with one embodiment of the present invention.
Figure 1B:
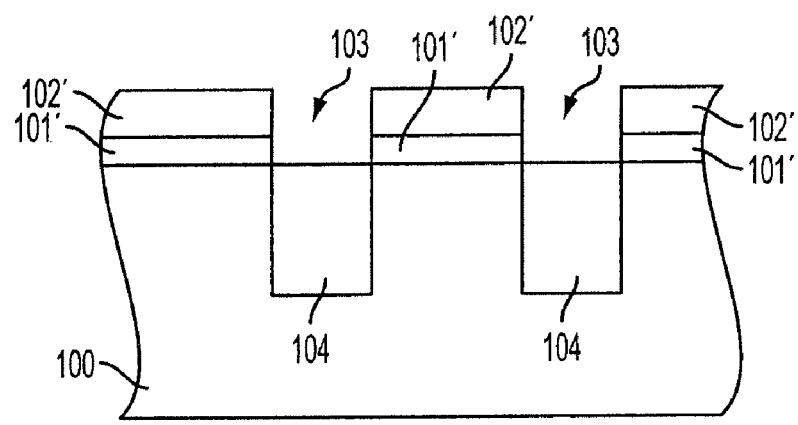
Figure 1C:
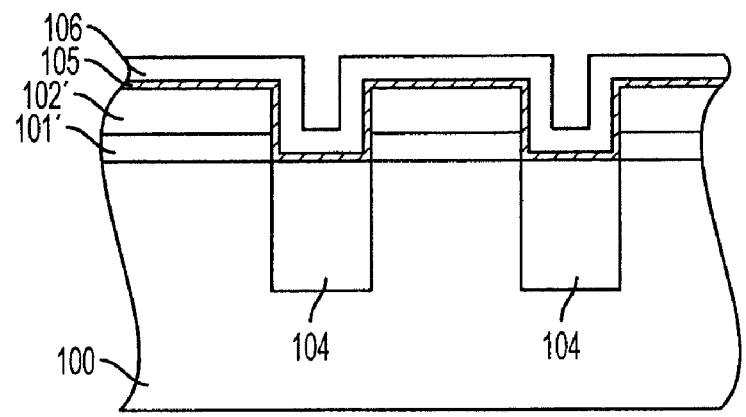
Figure 1D:
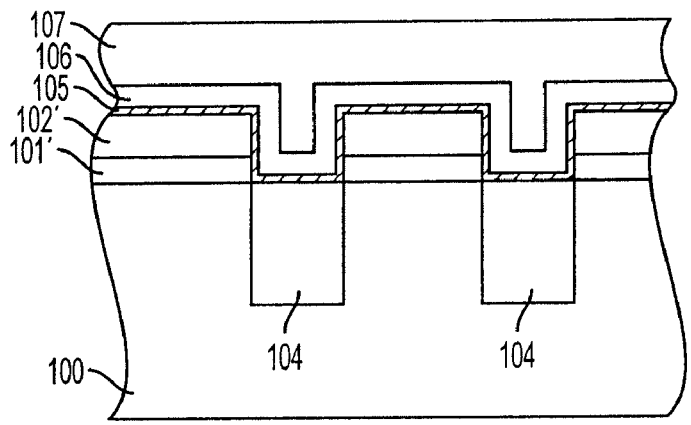
Figure 1E:
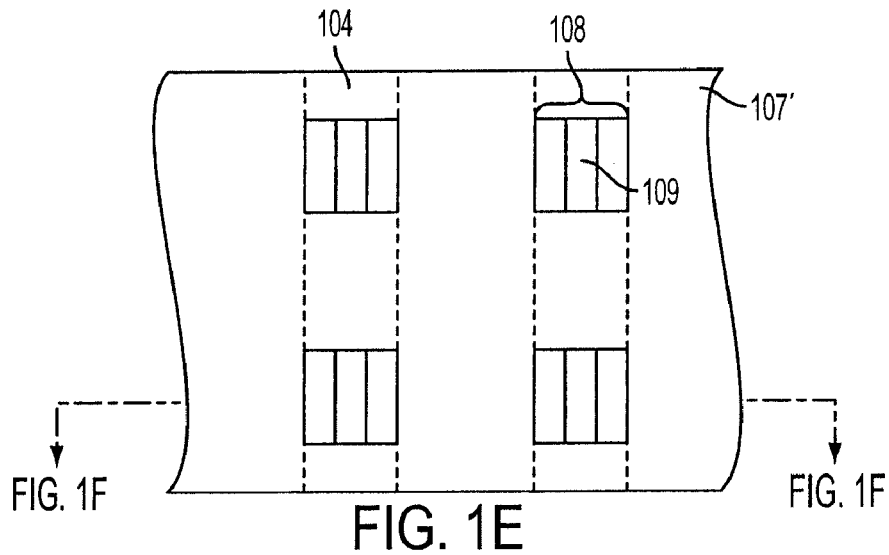
Figure 1F:
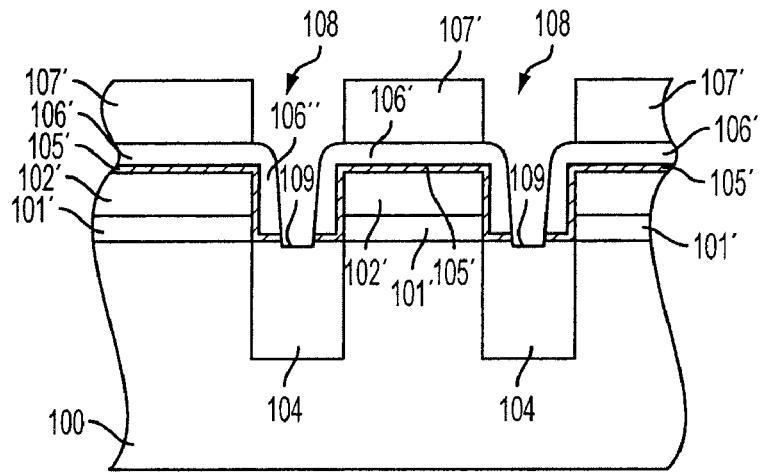
Figure 1G:
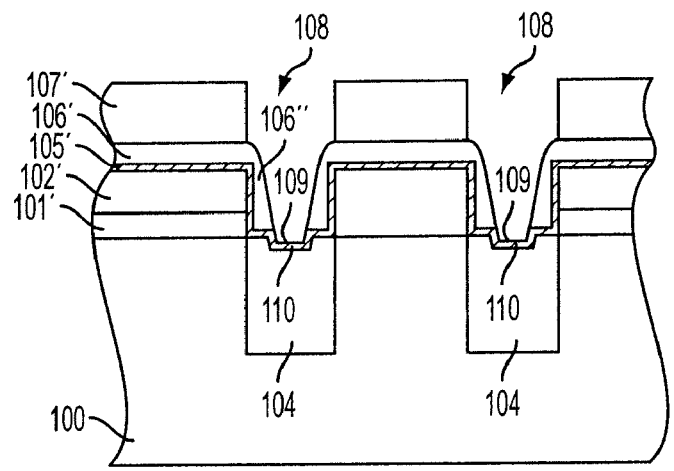
Figure 1H:
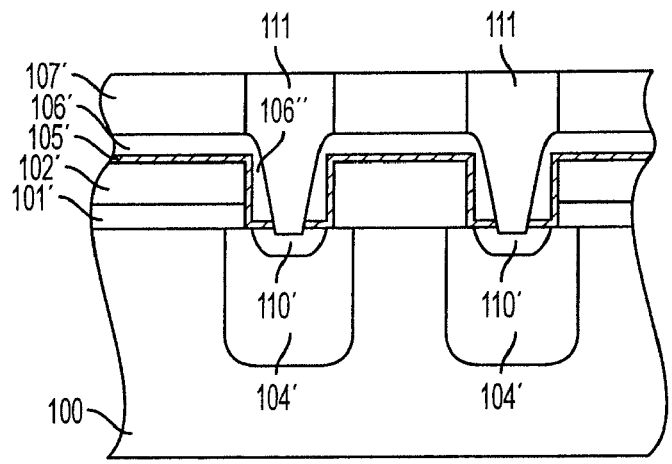
Figure 1I:
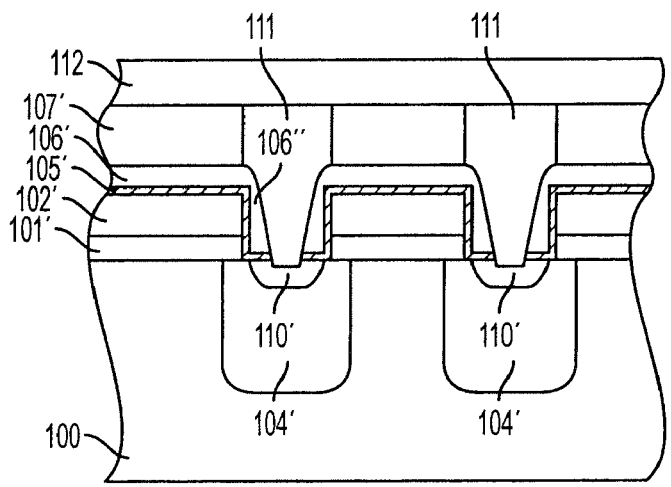
Figure 1J:
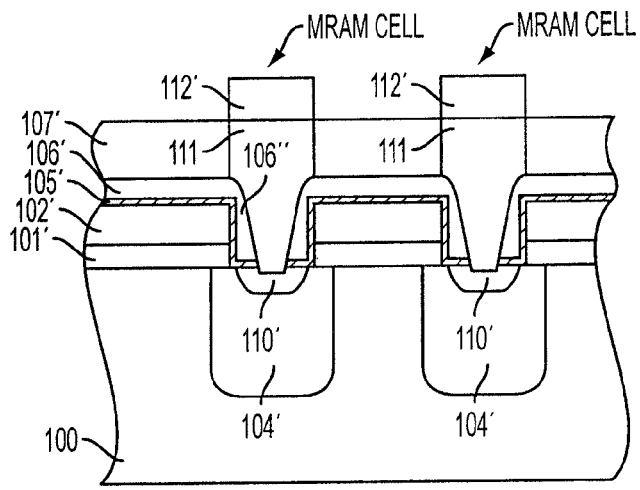
Figure 1K:
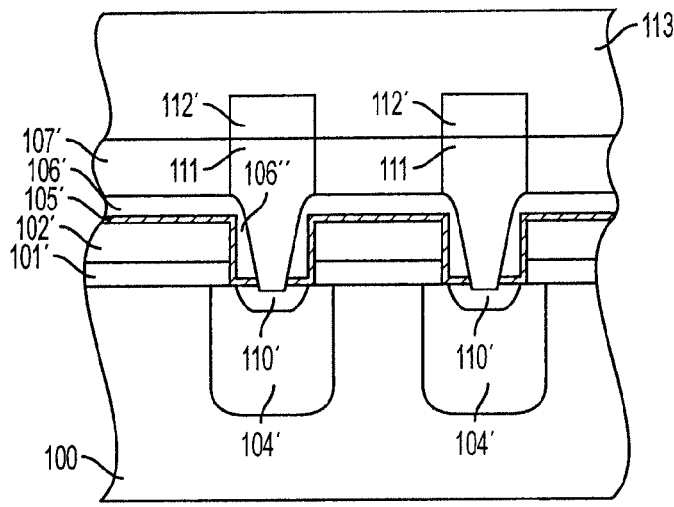
Figure 1L:
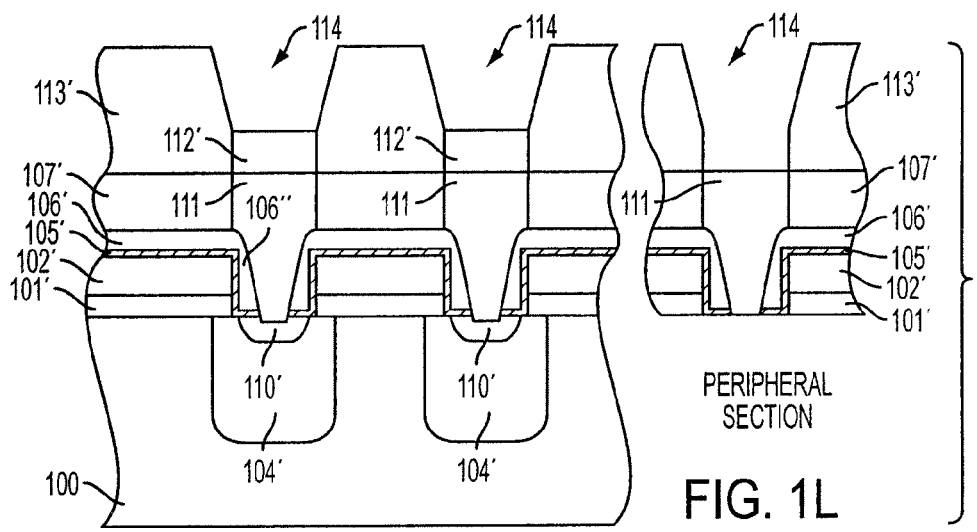
Figure 1M:
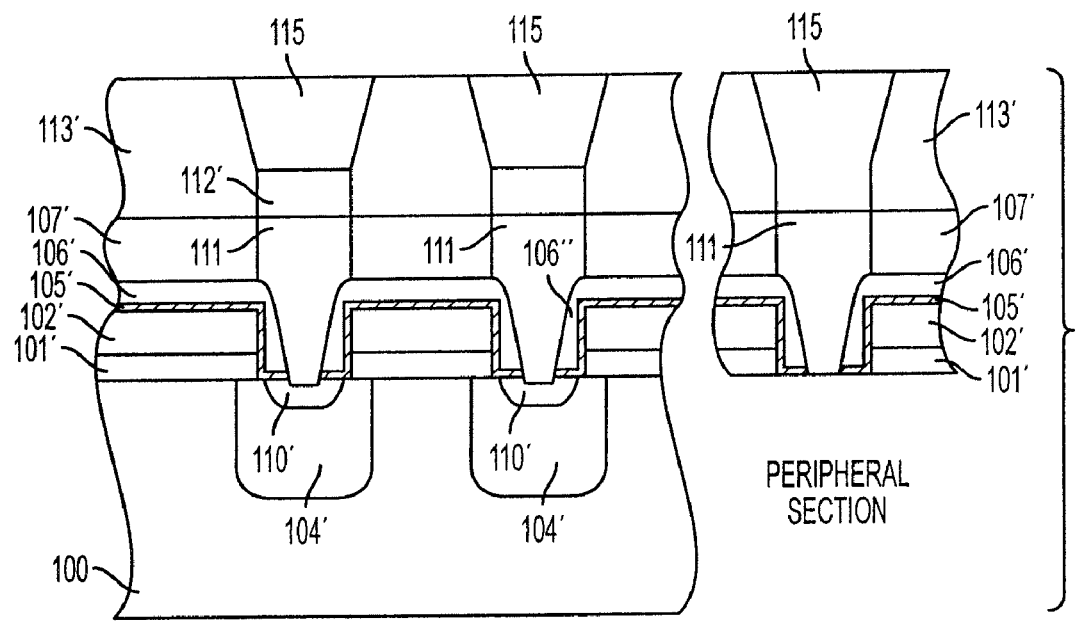
Figure 1N:
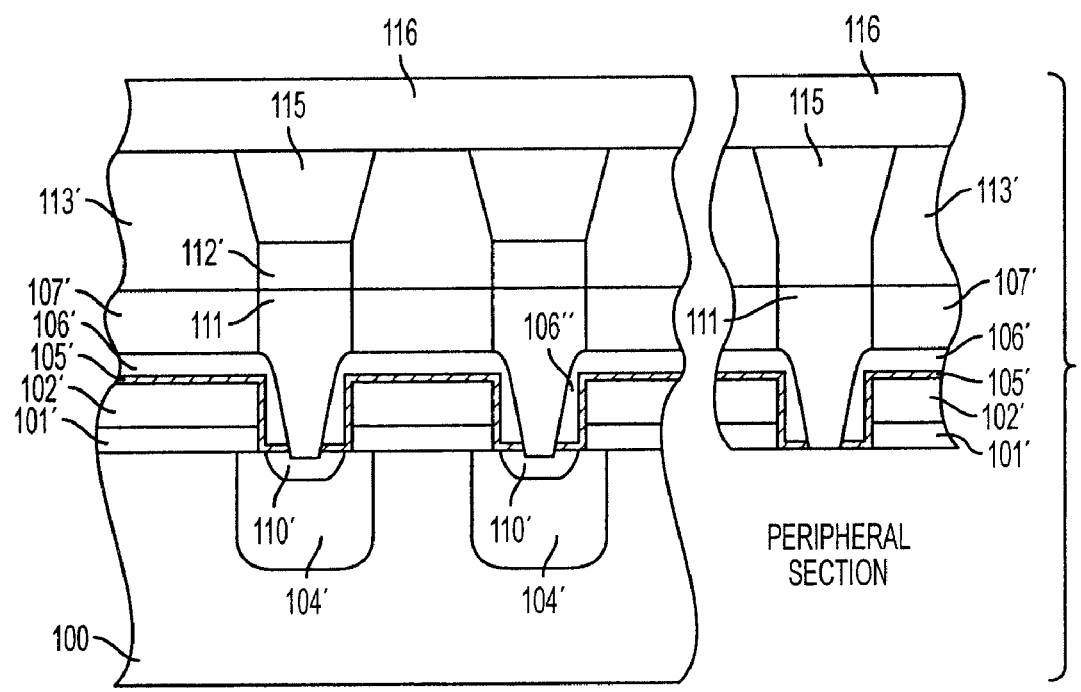

FIGS. 1(A)-(N) illustrate an exemplary method for fabricating magnetic random access memory (MRAM) cells along with the periphery in accordance with one embodiment of the present invention. For the purpose of clear demonstration, FIG. 1(A) to FIG. 1(K) will only show the fabrication process for the MRAM cells. Starting from FIG. 1(L), the peripheral section of the MRAM cells will be added to demonstrate how the fabrication of the peripheral section of the MRAM cells can be integrated with the fabrication of the MRAM cells.

As shown in FIG. 1(A), a p-type silicon substrate 100 with a width, a length, and a depth is provided. In one embodiment, the depth of the p-type silicon substrate 100 ranges from about 3000 Å to about 5000 Å. The p-type silicon substrate 100 could be a p-well implanted in an n-type silicon substrate using light dose of B and/or $BF_2$. Next, an isolation layer 101 is formed over the p-type silicon substrate 100 by a low-pressure chemical vapor deposition (LPCVD) method. In one embodiment, the isolation layer 101 has a thickness of about 500 Å. In another embodiment, the isolation layer 101 is formed of $SiO_2$ or other thermal oxide materials. Then, a metal silicide layer 102 is deposited over the isolation layer 101. In one embodiment, the metal silicide layer 102 has a thickness of about 1000 Å. In another embodiment, the metal silicide layer 102 is a tungsten silicide layer.

As shown in FIG. 1(B), the isolation layer 101 and the metal silicide layer 102 are patterned and etched until the underlying p-type silicon substrate is exposed, resulting in two trenches 103 formed along the length of the p-type silicon substrate 100. The remaining portions of the isolation layer 101 and the metal silicide layer 102 forms the isolation lines 101' and the metal silicide lines 102'. In one embodiment, the etching of the isolation layer 101 and the metal silicide layer 102 is performed by the inductively coupled plasma (ICP) etching and/or reactive ion etching (RIE) methods with one or more etching gases of $Cl_2$, $C_4F_8$, $CHF_3$, $CF_4$, Ar, and etc. Of course, the exemplary etching methods and etching gases are not intended to be exhaustive nor limit the invention to the precise material disclosed.

Thereafter, along the length of the p-type silicon substrate 100, two bottom implant (BI) regions 104 are formed by implanting n doping into the portions of the p-type silicon substrate 100 that are below the trenches 103. In order to improve the conductivity of the BI regions 104, the bottom portions of the BI regions 104 can be implanted with the n+ doping. Thus, the top portions of the BI regions 104, having the n doping, will be used to form a diode, while the bottom portions of the BI regions 104, having the n+ doping, will be used to enhance the conductivity of the BI regions 104. The BI regions 104 will also function as the bit lines of the MRAM cells.

As shown in FIG. 1(C), a conformal adhesion layer 105 is formed over the metal silicide lines 102' and the trenches 103. In one embodiment, the conformal adhesion layer 105 comprises about 100 Å low-pressure tetra-ethyl-ortho silicate (LPTEOS). Following the formation of the conformal adhesion layer 105, a conformal dielectric layer 106 is formed over the conformal adhesion layer 105. In one embodiment, the conformal dielectric layer 106 is a silicon nitride layer with a thickness ranges from about 300 Å to about 500 Å, and it is deposited by the LPCVD method with the processing gases of, for example, $SiH_4$ and/or $NH_3$, and etc. The conformal adhesion layer 105 serves as a liner and an adhesion layer for the conformal dielectric layer 106.

As shown in FIG. 1(D), an inter-layer dielectric (ILD) layer 107 is deposited over the conformal dielectric layer 106. In one embodiment, the ILD layer 107 has a thickness ranges from about 2000 Å to about 3500 Å. In another embodiment, the ILD layer 107 includes dielectric materials such as high-density plasma oxide, borophosphosilicate glass (BPSG), tetra-ethyl-ortho silicate (TEOS), and etc. Of course, the exemplary dielectric materials for the ILD layer 107 are not intended to be exhaustive nor limit the invention to the precise material disclosed. After ILD deposition, a chemical-mechanical polishing (CMP) process is needed to enable the ILD surface flat.

Next, as indicated from a top view of the ILD layer 107 in FIG. 1(E), the ILD layer 107 is patterned through a photoresist in order to form four contact holes 108 above the BI regions 104. The etching of the contact holes 108, performed by RIE and/or ICP method, comprises two steps: (1) During the first etching step, the ILD layer 107 is etched until the underlying conformal dielectric layer 106 is exposed. The etching gases used for the first etching step have high selectivity of oxide to silicon nitride. For example, the etching gases used for the first etching step could be $C_4F_6$ or $C_4F_8$ mixed with one or more of $CHF_3$, $CH_3F$, $CF_4$. (2). The second etching step uses etching gases such as $CHF_3$, $CH_3F$, and $CF_4$ to breakthrough the conformal dielectric layer 106 and the conformal adhesion layer 105. The second etching step further forms open contacts 109 by etching away about 100 Å p-type silicon substrate from the surface of the p-type silicon substrate 100. The sizes of the open contacts 109 can be tuned by the thickness of the conformal dielectric layer 106. The thicker the dielectric layer 106, the smaller of the open contacts 109.

The dashed lines in FIG. 1(E) represent the BI regions 104. The cross-sectional view along the A-A line is shown in FIG. 1(F). During the photography process for the contact holes 108, the tolerance of the misalignment is within the thickness of the conformal dielectric layer 106. The thicker the conformal dielectric layer 106, the larger the tolerance misalignment. As indicated from FIG. 1(F), after forming the contact holes 108, the remains of the conformal adhesion layer 105, the conformal dielectric layer 106, and the ILD layer 107 forms the adhesion layer 105', the dielectric layer 106', and the ILD layer 107'. The portions of the dielectric layer 106' that are positioned along the sidewalls of the trenches 103 can be defined as dielectric spaces 106".

As shown in FIG. 1(G), two shallow contact implant (CI) regions 110 are formed by implanting p+ doping into the BI regions 104 with very high dose of B and/or $BF_2$ by using very small energy. Because of the large angle tile drain (LATID) of the BI regions 104, the CI regions 110 are surrounded by the BI regions 104 except the sides of the CI regions 110 that align with the surface of the silicon substrate. In one embodiment, the dose of B and/or $BF_2$ is as high as $10^{19}/cm^2$.

As shown in FIG. 1(H), a drive-in process with a temperature of, for example, 900° C. to 1000° C. is performed such that the BI regions 104 and the CI regions 110 are diffused outward, resulting in the diffused BI regions 104' and the diffused CI regions 110'. The drive-in process also makes the diffused BI regions 104' and the diffused CI regions 110' more uniformed and smooth. After the driver-in process, the diffused CI regions 110' are still surrounded by the diffused BI regions 104' except for the sides of the diffused CI regions 110' that align with the surface of the p-type silicon substrate 100. Thus, the high quality single crystal self-aligned PN junction diodes are formed by the diffused BI regions 104' and the diffused CI regions 110'.

Next, contacts 111 are formed by filling the contact holes 108. The contacts 111 can be formed by filling the contact holes 108 with W or Cu. Before the W or Cu filling, an adhesion and barrier composite layer, comprising a Ti layer and a Ti Nitride layer, is deposited into the contact hole, wherein the Ti Nitride layer will be formed over the Ti layer. Then, the $WF_6$ is used by applying the chemical vapor deposition (CVD) method to fill in the contact holes 108 with W. Or, the electro-deposited technique is used to fill in the contact holes 108 with Cu. After the contact holes 108 are filled with W or Cu, a chemical mechanical polish (CMP) process is performed to remove the excessive W or Cu, and to prepare the surface of the ILD layer 107' for further processing. In one embodiment, about 1KÅ ILD layers 107' is removed after the CMP process. The formed contacts 111 are shown in FIG. 1(H). The CMP process only results in small recesses on the top surfaces of the contacts 111, achieving a better deposition for the composite MRAM material layer 112 in the next step.

As shown in FIG. 1(I), a composite MRAM material layer 112 is formed over the ILD layers 107' and the contacts 111. The composite MRAM material layer 112 can be formed with one of the MRAM structures such as the magnetic tunnel junction (MTJ) stack, the giant magneto resistance (GMR) stack, the colossus magneto resistance (CMR) stack, the MTJ with Savtchenko film stack, and the GMR with Savtchenko film stack.

The MTJ stack includes a magnetically free layer and a magnetically pinned layer. An insulating layer, such as thin $Al_2O_3$ or MgO layer with thickness of 0.5~3 nm, separates both two layers. The magnetization direction of magnetically pinned layer is pinned by magnetically pinning layer. The GMR stack includes a magnetically free layer and a magnetically pinned layer. A non-magnetic thin conductive layer, such as Cu, Ru, Cr, or Ag layer with thickness of 2~7 nm, separates both two layers. The magnetization direction of magnetically pinned layer is pinned by magnetically pinning layer. The MTJ with Savtchenko film stack includes a magnetically free triple-layer with a thin non-magnetically conductive layer, such as CoFe/Ru/CoFe etc., and a magnetically pinned layer. An insulating layer, such as thin $Al_2O_3$ or MgO layer with thickness of 0.5~3 nm, separates both two layers. The magnetization direction of magnetically pinned layer is pinned by magnetically pinning layer. The GMR with Savtchenko film stack includes a magnetically free triple-layer with a thin non-magnetically conductive layer, such as CoFe/Ru/CoFe etc., and a magnetically pinned layer. A non-magnetic thin conductive layer, such as Cu, Ru, Cr, or Ag layer with thickness of 2~7 nm, separates both two layers. The magnetization direction of magnetically pinned layer is pinned by magnetically pinning layer. The magnetically free and pinned layers of the above 4 structures, the MTJ stack, the GMR stack, the MTJ with Savtchenko film stack, and the GMR with Savtchenko film stack can be Fe, Co, Ni, and their alloys, such as CoFe, NiFe, CoFeNi, CoFeB, etc., with the thickness range of 2 nm~50 nm. The magnetically pinning layer can be PtMn, FeMn, IrMn, or others Mn-based antiferromagnetic material with the thickness range of 10 nm~100 nm. The CMR film includes a Mn-based multiple oxide alloy with metallic doping, such as LaSrMnO, LaCaMnO, PrCaMnO, etc., with the thickness range of 10 nm~500 nm.

The composite MRAM material layer 112 can have both in-plane and perpendicular magnetization directions relative to the top surface of the MRAM material layer. The deposition of the composite MRAM material layer 112 can be performed by the physical vapor deposition (PVD) method, the Ion metal deposition method, the Ion Beam deposition (IBD) method, the e-beam deposition method, and etc. with or without applied magnetic field.

As shown in FIG. 1(J), the composite MRAM material layer 112 is patterned and etched such that MRAM devices 112' are formed over the contacts 111. Thus, the MRAM cells, each of which includes a MRAM device 112' and a single crystal self-aligned PN junction diode, are formed. As mentioned above, each single crystal self-aligned PN junction diode includes a diffused CI region 110' and a diffused BI region 104'. Each single crystal self-aligned PN junction diode plays the role of a selective device for a MRAM cell.

In one embodiment, the etching of the composite MRAM material layer 112 is carried out by either RIE or ICP method with etching gases of Co, $NH_3$, $CHF_3$, Ar, $Cl_2$, $BCl_3$ and/or $O_2$. For the peripheral section of the MRAM cells (not shown in FIG. 1(J)), the composite MRAM material layer 112 over the peripheral section needs to be completely removed.

In order to gain a better magnetization alignment for the formed MRAM cells, a magnetically annealing process is performed for the MRAM cells by furnace or the rapid thermal annealing (RTA) method with magnetic field such as 1000 Oe for MTJ and GMR structured MRAM cells, or 1 T for CMR structured MRAM cells. In one embodiment, the temperature for the magnetically annealing process of the MRAM cells is about 300° C. for the MRJ and GMR structured MRAM cells, or about 600° C. for CMR structured MRAM cells. During the magnetically annealing process, a MRAM cell is magnetized according to its preferred magnetization direction (in-plane or perpendicular).

As shown in FIG. 1(K), an inter-metal dielectric (IMD) layer 113 is deposited over the MRAM devices 112' and the ILD layers 107' by a low temperature process. The IMD layer 113 may be formed of any suitable dielectric material, such as, for example, HDP oxide, plasmas enhanced tetra ethyl orthosilane (PETEOS), hydrogen block oxide (HBO). In one embodiment, the IMD layer 113 has a thickness ranging from about 2000 to about 3500 Å.

As shown in FIG. 1(L), the IMD layer 113 is patterned and etched such that via contact holes 114 are formed. The remaining of the IMD layer 113 forms the IMD layer 113'. The via etching, i.e., the etching for the via contact holes, can be carried out by either ICP or RIE method with etching gases of, for example, $CHF_3$, $CF_4$, and Ar. The mask for patterning the via contact holes 114 can be the same as the mask used to pattern the contact holes 108. In one embodiment, the via etching for the MRAM cells will continue until the antireflective coating (ARC) layer of the MRAM device 112' is reached, resulting in a loss of about 300 Å of ARC layer of the MRAM device 112'. However, due to the lack of MRAM devices in the peripheral section, the via etching in the periphery section will continue until the contact 111 of peripheral section is reached.

For the MTJ and the GMR structured MRAM cells, due to the current perpendicular to plane (CPP) requirement, the via etching cannot be un-landing on the MRAM devices 112'. Therefore, the high passivation etching recipe such as high $ChF_3/CF_4$ gas ratio is needed for the MTJ and the GMR structured MRAM cells. For the CMR structured MRAM cells, the un-landing via etching is acceptable.

As shown in FIG. 1(M), the via contact holes 114 are filled with conductive materials such as W or Cu. Before the W or Cu filling, a Ti layer and a Ti Nitride layer need to be deposited into the via contact holes 114 to act as an adhesion and barrier composite layer, wherein the Ti Nitride layer will be formed over the Ti layer. In one embodiment, the CVD method is used to deposit W into the via contact holes 114 with $WF_6$. In another embodiment, the electro-deposited technique is used to fill in the via contact holes 114 with Cu. As a result, the via contact 115 are formed as indicated in FIG. 1(M). Thereafter, a CMP process is performed to remove the excessive W or Cu and to prepare the surface of the IMD layer 113' for further processing. In one embodiment, about 1KÅ IMD layers 113' are removed after the CMP process.

As shown in FIG. 1(N), a metal layer is formed over the via contacts 115 and the IMD layers 113'. In one embodiment, the metal layer is formed of AlCu or Cu by the PVD method, the ion metal deposition method, or the electro depositing method. In another embodiment, the metal layer has a thickness of about 2 KÅ. Before the metal layer deposition, an adhesion and barrier composite layer, such as Ti layer and Ti Nitride layer may be needed. The metal layer is then patterned and etching to form a transversal metal line 116 along the width of the p-type silicon substrate 100. The etching for the metal layer can be performed by the ICP or the RIE method with the etching gases of, for example, $Cl_2$, $BCl_3$, $N_2$, and/or $CHF_3$. The transversal metal line 116 functions as a word line for the MRAM cells.

Figure 2:
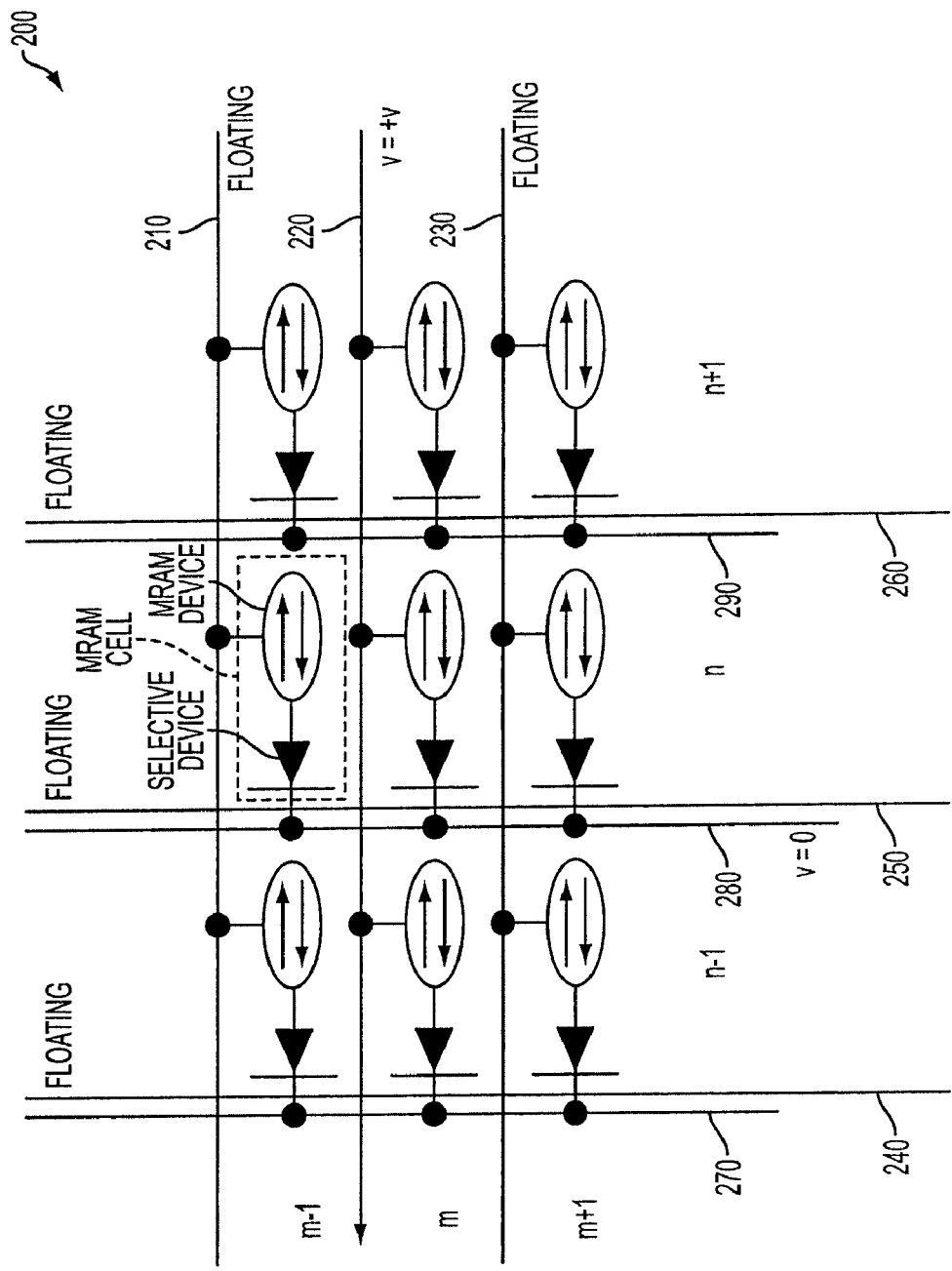
FIG. 2 illustrates an exemplary method for reading a MRAM cell in a MRAM array in accordance with one embodiment of the present invention.

FIG. 2 illustrates an exemplary method for reading a MRAM cell in a MRAM array 200 in accordance with one embodiment of the present invention. The MRAM array 200 includes nine MRAM cells arranged in three rows (m−1, m, and m+1) and three columns (n−1, n, and n+1). Each MRAM cell includes a MRAM device and a selective device, wherein the MRAM device has either a in-plane or perpendicular magnetization direction relative to the surface of the MRAM device, and the selective device is a single crystal self-aligned diode. The word lines 210, 220, and 230 of the MRAM array 200 are connected to the metal line 116 of each of the MRAM cells in the n−1, m, and m+1 rows, respectively. The metal silicide lines 240, 250, and 260 and the bit lines 270, 280, and 290 are connected to the metal silicide lines 102' and the diffused BI region 104' of each of the MRAM cells in the n−1, n, n+1 columns, respectively. In the present embodiment, the MRAM cell (m, n) that is located in the m row and n column is read.

For the read operation for the MRAM cell (m, n), the word line 220 is applied with a positive voltage and the bit line 280 is grounded. In one embodiment, the positive voltage applied to the word line 220 ranges from about 1V to about 1.5V. The other word lines 210 and 230 are floating, whereas the other bit lines 270 and 290 can be either floating or grounded. All the metal silicide lines 240, 250, and 260 can be floating. As a result, a current will flow through the MRAM cell (m, n) from the word line 220 to the bit line 280, and this current will be used to sense the logic state of the MRAM cell (m, n). The flow direction of the current is shown in FIG. 2.

Figure 3A:
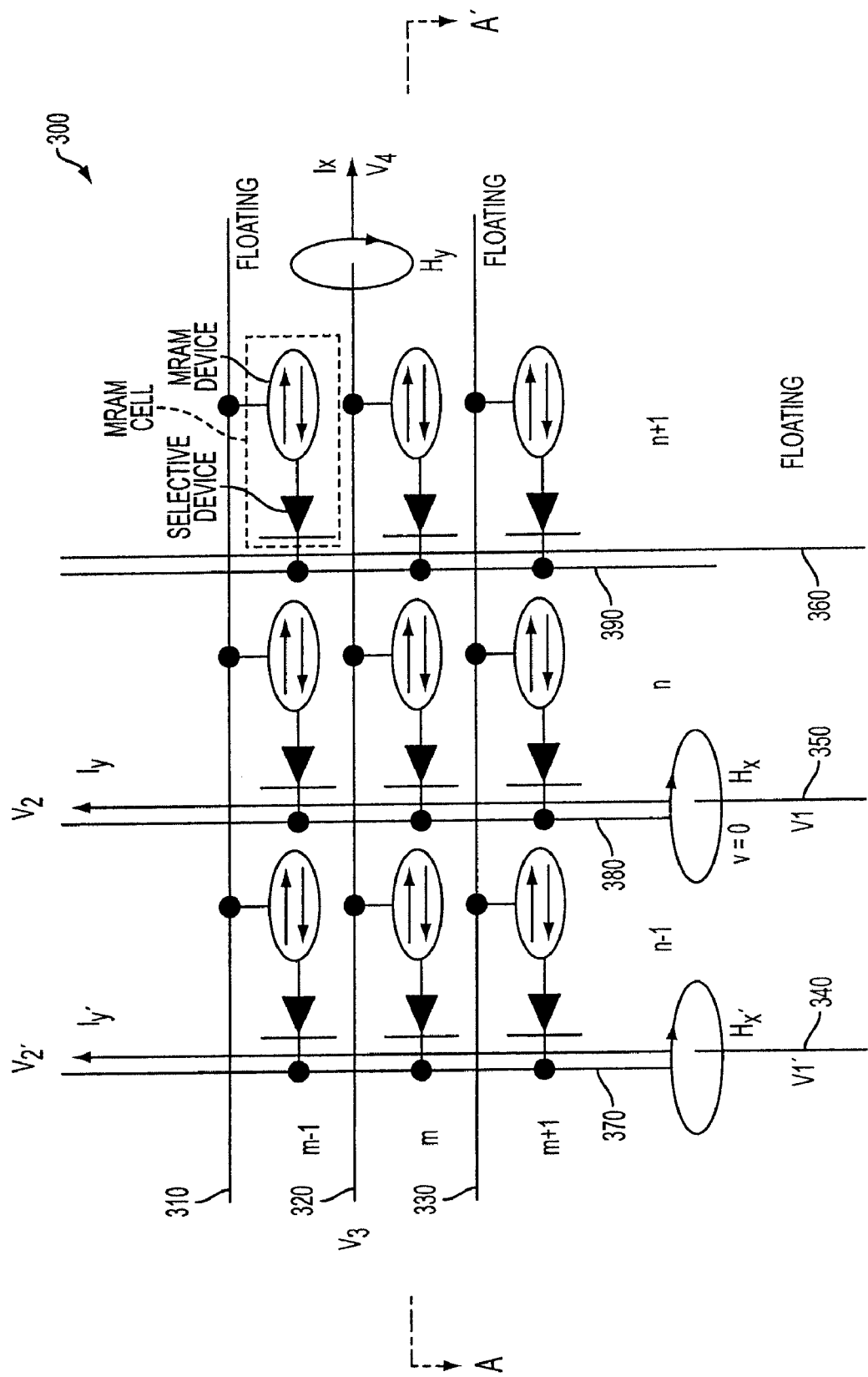
FIG. 3(A)-(B) illustrate an exemplary method for programming a MRAM cell with an in-plane magnetization direction in a MRAM array in accordance with one embodiment of the present invention.
Figure 3B:
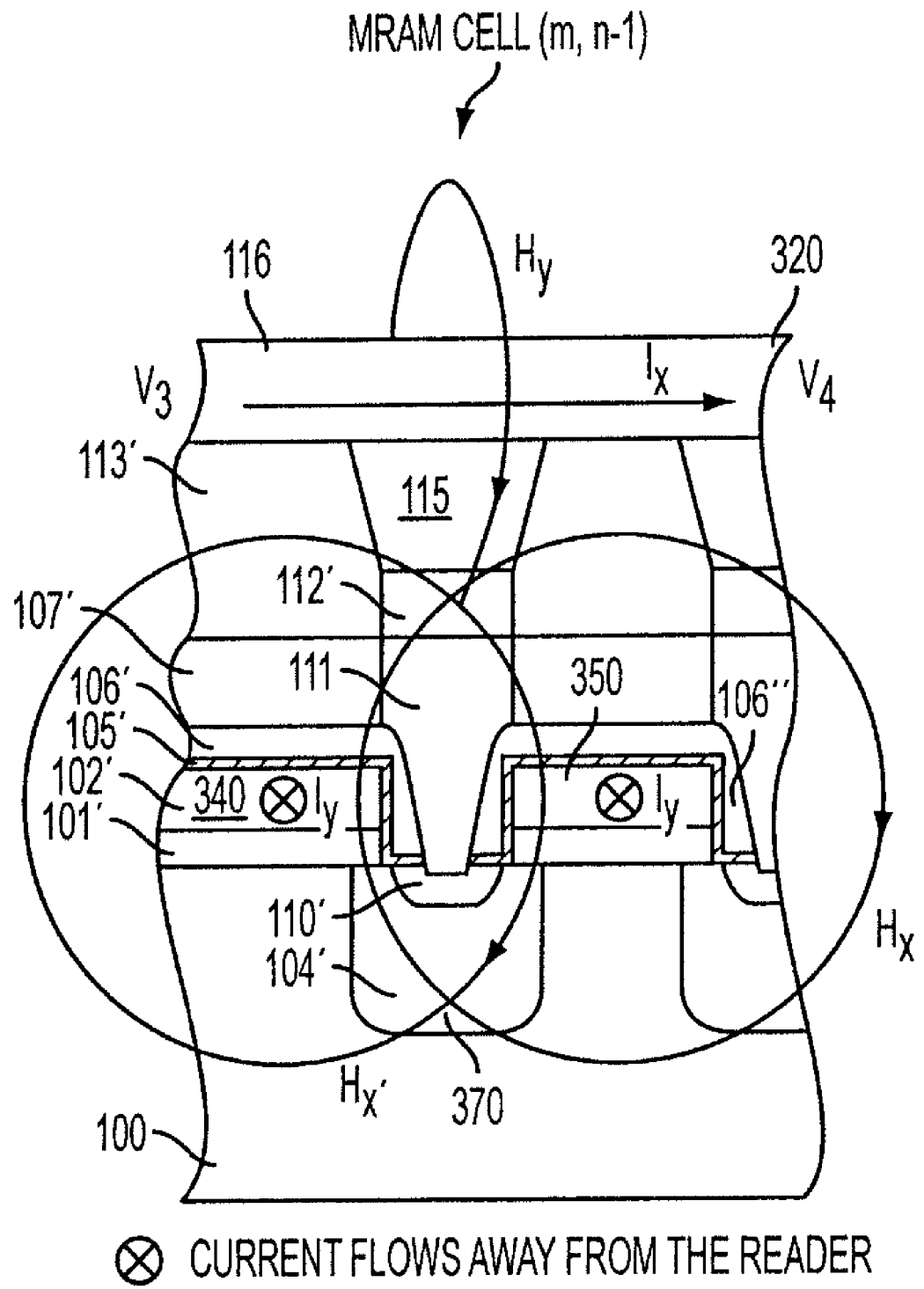

FIG. 3(A)-(B) illustrate an exemplary method for programming a MRAM cell with an in-plane magnetization direction in a MRAM array 300 in accordance with one embodiment of the present invention. The MRAM array 300 includes nine MRAM cells arranged in three rows (m−1, m, and m+1) and three columns (n−1, n, and n+1). Each MRAM cell includes a MRAM device and a selective device, wherein the MRAM device has an in-plane magnetization direction relative to the surface of the MRAM device, and the selective device is a single crystal self-aligned diode. The word lines 310, 320, and 330 of the MRAM array 300 are connected to the metal line 116 of each of the MRAM cells in the m−1, m, and m+1 rows, respectively. The metal silicide lines 340, 350, and 360 and the bit lines 370, 380, and 390 are connected to the metal silicide line 102' and the diffused BI region 104' of each of the MRAM cells in the n−1, n, n+1 columns, respectively. In the present embodiment, the MRAM cell (m, n−1) that is located in the m row and n−1 column is programmed.

As shown in FIG. 3(A), voltage differences ($V_1-V_2$) and ($V_1'-V_2'$) are respectively applied to the metal silicide lines 350 and 340, which are positioned respectively adjacent to the right side and the left side of the MRAM cell (m, n−1) to be programmed. As a result, the programming currents Iy and Iy' are induced in the metal silicide lines 350 and 340, respectively. In one embodiment, both $V_1$ and $V_1'$ is about 1V, both $V_2$ and $V_2'$ are grounded, and the resistance of each of the metal silicide lines 340 and 350 is about 1 KΩ. Thus, each of the induced programming currents Iy and Iy' is about 1 mA. The flow directions of the induced programming currents Iy and Iy' are indicated in FIG. 3(A).

The word line 320 of the MRAM cell (m, n−1) is applied with a voltage difference ($V_3-V_4$) to induce a programming current Ix in the word line 320. The flow direction of the induced programming current Ix is shown in FIG. 3(A). In one embodiment, the $V_3$ is about −2.5V, the $V_4$ is about −2V, and the resistance of the word line 320 is about 500Ω. Thus, the induced programming current Ix is about 1 mA. Because $V_3$ and $V_4$ are negative voltages, no current will flow through the MRAM cell (m, n−1) to disturb the programming operation. To programming the MRAM cell (m, n−1), the remaining word lines of the MRAM array 300 are floated and all the bit lines 370, 380, and 390 are grounded. The programming currents Iy, Iy' and Ix can be generated in any order.

As shown in FIG. 3(B), the induced programming currents Iy and Iy' in the metal silicide lines 350 and 340 generate respectively the circular magnetic fields Hx and Hx', while the induced programming current Ix in the word line 320 generates a circular magnetic field Hy. The directions of the circular magnetic fields Hx, Hx', and Hy are indicated in FIG. 3(A) and FIG. 3(B). If the combination of the magnetic fields Hx, Hx', and Hy is larger than the coercivity He of the MRAM cell (m, n−1), the magnetization direction of the MRAM device of the MRAM cell (m, n−1) would be forced to change, i.e., the MRAM cell (m, n−1) is programmed.

The programming currents Iy, Iy', and Ix used to program the MRAM cell (m, n−1) can be estimated by the Ampere's law:

$$H = \frac{I}{2\pi r}(A/m)$$

where I is the programming current, r is the distance from the center of the programming current conductive line (the metal silicide line or the word line) to the MRAM cell to be programmed, and H is the magnetic field generated by the programming current. Based on the programming current Ix, Iy, and Iy', the programming voltages applied to the word line and the two adjacent metal silicide lines can be calculated, if the resistance of each metal silicide line and the resistance of the word line are known.

Figure 4A:
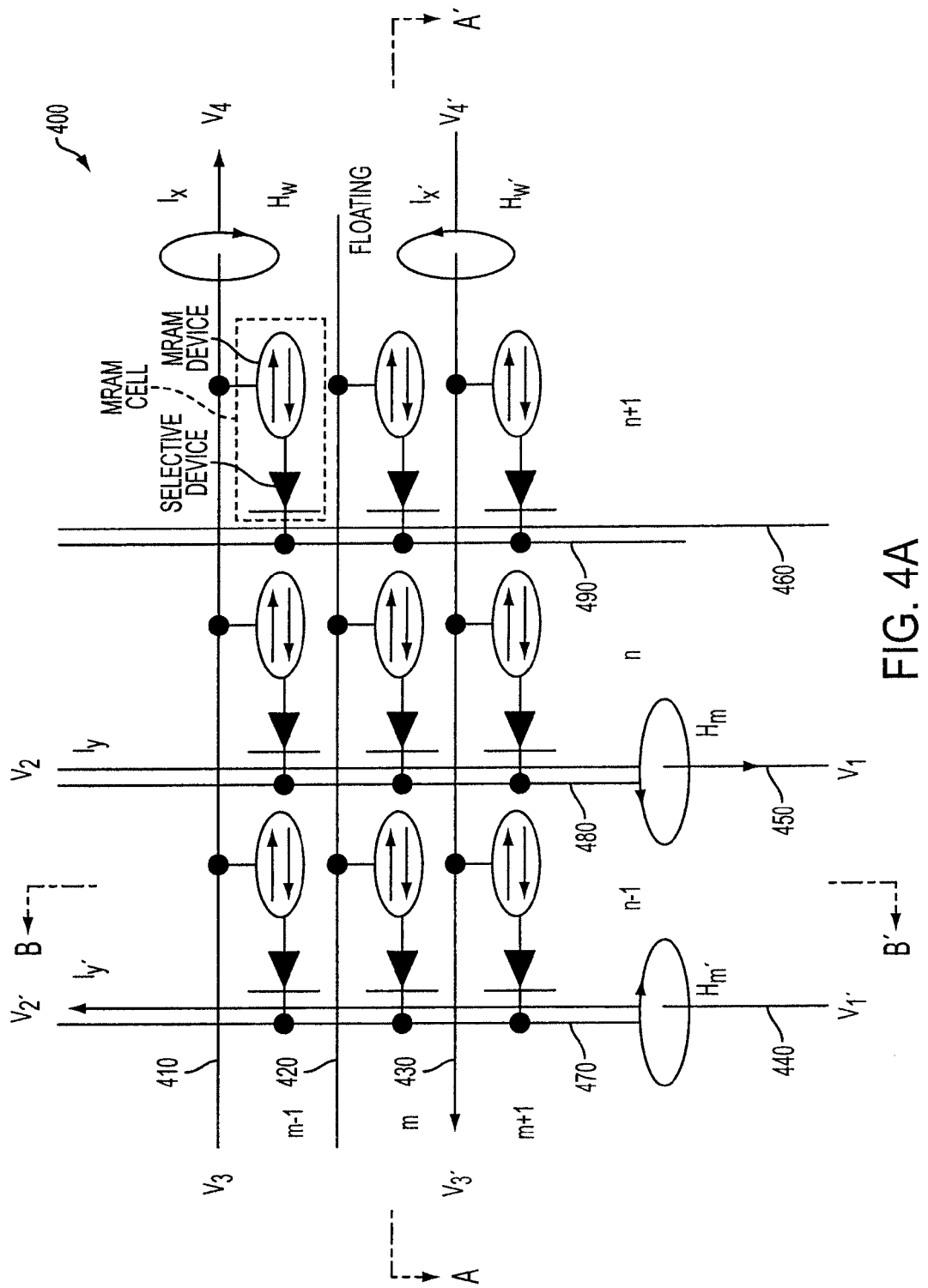
FIG. 4(A)-(C) illustrate an exemplary method for programming a MRAM cell with a perpendicular magnetization direction in a MRAM array in accordance with one embodiment of the present invention.
Figure 4B:
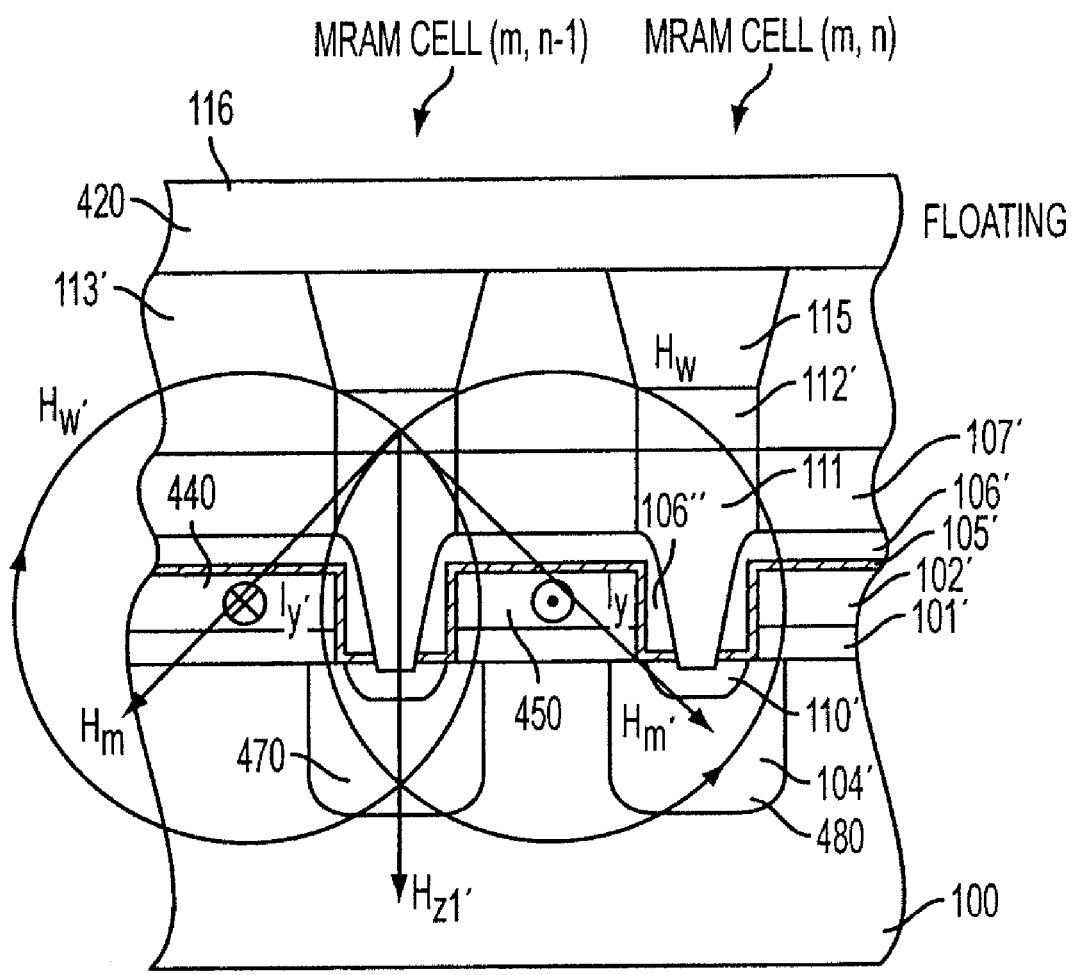
Figure 4C:
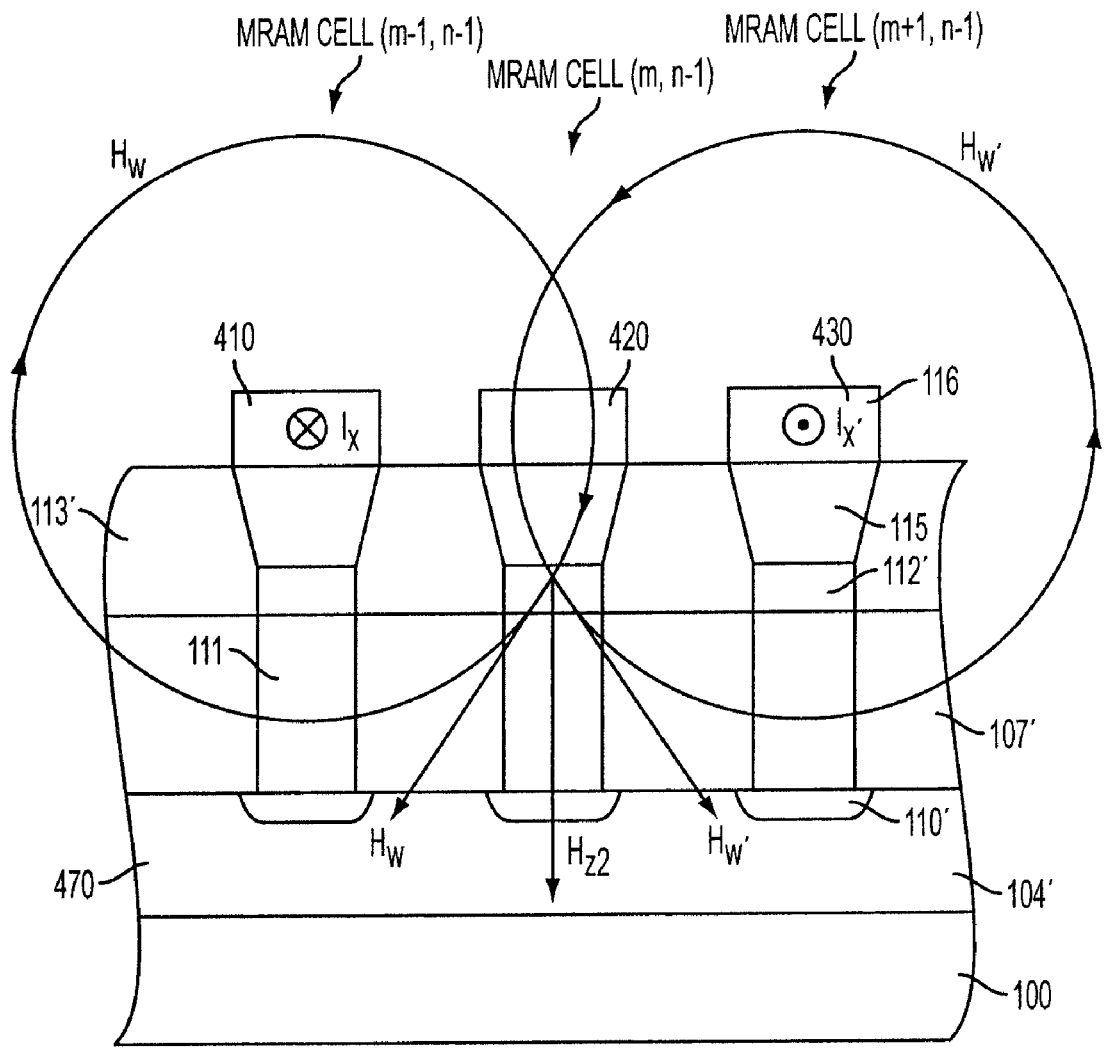

FIG. 4(A)-(C) illustrate an exemplary method for programming a MRAM cell with a perpendicular magnetization direction in a MRAM array 400 in accordance with one embodiment of the present invention. The MRAM array 400 includes nine MRAM cells arranged in three rows (m−1, m, and m+1) and three columns (n−1, n, and n+1). Each MRAM cell includes a MRAM device and a selective device, wherein the MRAM device has a perpendicular magnetization direction relative to the surface of the MRAM device, and the selective device is a single crystal self-aligned diode. The word lines 410, 420, and 430 of the MRAM array 400 are connected to the metal line 116 of each of the MRAM cells in the m−1, m, and m+1 rows, respectively. The metal silicide lines 440, 450, and 460 and the bit lines 470, 480, and 490 are connected to the metal silicide line 102' and the diffused BI region 104' of each of the MRAM cells in the n−1, n, n+1 columns, respectively. In the present embodiment, the MRAM cell (m, n−1) that is located in the m row and n−1 column is programmed.

As shown in FIG. 4(A), voltage differences ($V_2-V_1$) and ($V_1'-V_2'$) are respectively applied to the metal silicide lines 450 and 440, which are positioned adjacent to the right side and the left side of the MRAM cell (m, n−1) to be programmed. As a result, programming currents Iy and Iy' are induced in the metal silicide lines 450 and 440, respectively. The flow directions of the programming currents Iy and Iy' are opposite to each other. In one embodiment, the $V_1$ and $V_2'$ are grounded, the $V_1'$ and $V_2$ are about 1V.

Next, voltage differences ($V_3-V_4$) and ($V_4'-V_3'$) are applied to the word lines 410 and 430 to induce the programming currents Ix and Ix'. The flow directions of the programming currents Ix and Ix' are opposite to each other. In one embodiment, the $V_3$ and $V_4'$ are about −2.0V, the $V_4$ and $V_3'$ are about −2.5V. Because negative voltages are applied to the work lines 410 and 430, no current will flow through the MRAM cells in the MRAM array 400 to disturb the programming operation. To programming the MRAM cell (m, n−1), the remaining word line 420 and the remaining metal silicide line 460 of the MRAM array 400 are floated and all the bit lines 470, 480, and 490 are grounded.

As shown in FIG. 4(A), the programming currents Iy, Iy', Ix, and Ix', which can be generated in any order, produce the circular magnetic fields Hm, Hm', Hw, and Hw', respectively. The directions of the circular magnetic fields Hm, Hm', Hw, and Hw' are indicated in FIG. 4(A)-(C).

FIG. 4(B) shows the magnetic fields Hm and Hm' that respectively encircle the programming current Iy and Iy' in the metal silicide lines 450 and 440. Both magnetic fields Hm and Hm' produce the perpendicular magnetic field component Hz1, whereas the in-plane magnetic field components generated by the magnetic fields Hm and Hm' are cancelled off by each other.

FIG. 4(C) shows the magnetic fields Hw and Hw' that respectively encircle the programming current Ix and Ix' in the word lines 410 and 430. Both of the magnetic fields Hw and Hw' contribute to the perpendicular magnetic field component Hz2, whereas the in-plane magnetic field components generated by the magnetic fields Hw and Hw' are cancelled off by each other. Therefore, for the MRAM cell (m, n−1), the perpendicular magnetic field Hz=Hz1+Hz2. If the perpendicular magnetic field Hz is larger than the coercivity Hc of the MRAM cell (m, n−1), the magnetization direction of the MRAM device of the MRAM cell (m, n−1) would be forced to change, i.e., the MRAM cell (m, n−1) is programmed.

Accordingly, The programming currents Iy, Iy', Ix and Ix' can be estimated by the Ampere's law:

$$H = \frac{I}{2\pi r}(A/m)$$

where I is the programming current, r is the distance from the center of the programming current conductive line (the metal silicide line or the word line) to the MRAM cell to be programmed, and H is the magnetic field generated by the programming current.

One feature of the present invention is that the number of masks used in the fabrication process of the invented MRAM cell is very low, as compared with the one used for fabricating a conventional MRAM cell, a flash memory cell, an ovonic unified memory (OUM) cell, and a FeRAM cell. Another feature of the present invention is that the disclosed fabrication process has only one metal line on the top of a MRAM device of a MRAM cell, while the metal silicide lines are embedded adjacent to the opposite sides of the MRAM cell. The third feature of the present invention is that, due to the single crystal self-aligned diode, the invented MRAM cell can be fabricated with a small size. In one embodiment, the size of the invented MRAM device is about $4F^2$. As a result, the distance, i.e., the r, from the center of a programming current conductive line (a word line or a metal silicide line) to the MRAM cell is small. According to the Ampere's law, the smaller r will result in a smaller programming current for a MRAM cell with a constant coercivity. Hence, the invented MRAM cell can avoid the large current density problem. In one embodiment, the programming current density for the present invention is equal or less than $5.4 \times 10^6$ A/cm$^2$.

Because the number of the masks and the number of the metal layer required to fabricate the invented MRAM cell and the size of the invented MRAM cell are compatible to the ones used for fabricating a mask programmed read only memory (mask-ROM), the fabrication process for the invented MRAM cell is simple and inexpensive. Furthermore, the size of the selective device, i.e., the single crystal self-aligned diode, is mainly determined by the thickness of the liner dielectric material layer 106, which leads to a large process window.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modification s according to the particular purpose contemplated. The scope of the invention is intended to be defined by the claims appended hereto and their equivalents.

What is claimed is:

1. A magnetic random access memory (MRAM) cell, comprising:
    a silicon substrate;
    a bottom implant (BI) region in the silicon substrate, the BI region having opposing sides contacting the substrate and a first polarity;
    a contact implant (CI) region being positioned in portion of the silicon substrate that is within the BI region such that the CI region is surrounded by the BI region except for a side of the CI region that aligns with surface of the silicon substrate, the CI region having a second polarity which is opposite to the first polarity of the BI region, wherein the BI region and the CI region form a single crystal self-aligned diode;
    a contact formed over the CI region;
    a layer forming first and second spacers adjacent to the contact and respectively at opposite sidewalls of the contact over the silicon substrate;
    first and second metal silicide lines covering a portion of the bottom implant (BI) region and defined respectively at least partially under the layer and adjacent to the first spacer and the second spacer; and
    a MRAM device defined over of the contact.

2. The magnetic random access memory (MRAM) cell as recited in claim 1, further comprising:
    a via contact defined over the MRAM device; and
    a metal line defined over the via contact, wherein the metal line is perpendicular to each of the first metal silicide line and the second metal silicide line.

3. The magnetic random access memory (MRAM) cell as recited in claim 1, wherein the BI region is a n doped region, the CI region is a p+ doped region, and the silicon substrate is a p-type silicon substrate.

4. The magnetic random access memory (MRAM) cell as recited in claim 3, wherein bottom portion of the BI region is a n+ doped region.

5. The magnetic random access memory (MRAM) cell as recited in claim 1, wherein magnetization direction of the MRAM device is in-plane or perpendicular to surface of the MRAM device.

6. The magnetic random access memory (MRAM) cell as recited in claim 1, wherein the MRAM device has a MRAM structure that is selected from the group consisting of magnetic tunnel junction (MTJ) stack, giant magneto resistance (GMR) stack, colossus magneto resistance (CMR) stack, the MTJ with Savtchenko film stack, and the GMR with Savtchenko film stack.

7. The magnetic random access memory (MRAM) cell as recited in claim 6, wherein the magnetic tunnel junction (MTJ) stack comprising:
    a magnetically free layer;
    a magnetically pinning layer;
    a magnetically pinned layer by magnetically pinning layer; and
    an insulating layer.

8. The magnetic random access memory (MRAM) cell as recited in claim 1, wherein said MRAM device comprise a giant magneto resistance (GMR) stack, the giant magneto resistance (GMR) stack comprising:
    a magnetically free layer;
    a magnetically pinning layer;
    a magnetically pinned layer by magnetically pinning layer; and
    a non-magnetic thin conductive layer.

9. The magnetic random access memory (MRAM) cell as recited in claim 1, wherein said MRAM device comprise a magnetic tunnel junction (MTJ) with Savtchenko film stack, the MTJ with Savtchenko film stack comprising:
    a magnetically free triple-layer with a thin non-magnetically conductive layer;
    a magnetically pinning layer;
    a magnetically pinned layer by magnetically pinning layer; and
    an insulating layer.

10. The magnetic random access memory (MRAM) cell as recited in claim 1, wherein said MRAM device comprise a giant magneto resistance (GMR) with Savtchenko film stack, the GMR with Savtchenko film stack comprising:
    a magnetically free triple-layer with a thin non-magnetically conductive layer;
    a magnetically pinning layer;
    a magnetically pinned layer by magnetically pinning layer; and
    an insulating layer.

11. The magnetic random access memory (MRAM) cell as recited in claim 1, wherein the MRAM cell has a size of about 4 $F^2$.

12. The magnetic random access memory (MRAM) cell as recited in claim 1, wherein the first spacer and the second spacer are formed of silicon nitride, and thickness of each of the first spacer and the second spacer defines size of the single crystal self-aligned diode.

\* \* \* \* \*